(12) United States Patent
Anzai

(10) Patent No.: US 7,829,355 B2
(45) Date of Patent: Nov. 9, 2010

(54) METHOD FOR INSPECTING SEMICONDUCTOR DEVICE

(75) Inventor: Yasuhito Anzai, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 194 days.

(21) Appl. No.: 12/134,406

(22) Filed: Jun. 6, 2008

(65) Prior Publication Data

US 2009/0042322 A1 Feb. 12, 2009

(30) Foreign Application Priority Data

Aug. 7, 2007 (JP) .............................. 2007-205708

(51) Int. Cl.
*H01L 21/00* (2006.01)

(52) U.S. Cl. .............................. 438/15; 438/17; 438/19; 257/E21.007; 257/E21.207; 257/E21.585; 257/E21.599

(58) Field of Classification Search ............. 438/15–19; 257/E21.007, 201, 585, 599
See application file for complete search history.

(56) References Cited

U.S. PATENT DOCUMENTS

| 4,556,317 | A | * | 12/1985 | Sandland et al. ......... 356/237.1 |
| 4,881,863 | A | * | 11/1989 | Braginsky ............... 414/225.01 |
| 2002/0076654 | A1 | * | 6/2002 | Hasegawa et al. ........... 430/311 |

FOREIGN PATENT DOCUMENTS

| JP | 02103947 | 4/1990 |
| JP | 05054694 | 3/1993 |
| JP | 08122209 | 5/1996 |
| JP | 2000-121494 | 4/2000 |
| JP | 2005216904 | 8/2005 |
| JP | 2006310817 | 11/2006 |

* cited by examiner

*Primary Examiner*—Michael S Lebentritt
(74) *Attorney, Agent, or Firm*—Volentine & Whitt, P.L.L.C.

(57) ABSTRACT

A method for inspecting a semiconductor device includes carrying out a first test for inspecting characteristics of semiconductor devices under a shielded (dark) condition to discriminate non-defective devices; and carrying out a second test on the semiconductor devices which have passed the first test as non-defective devices, for inspecting characteristics of the semiconductor devices. The second test is carried out while a predetermined color of light is applied to the semiconductor devices.

5 Claims, 3 Drawing Sheets

METHOD FOR INSPECTING SEMICONDUCTOR DEVICE

CROSS REFERENCE TO RELATED APPLICATION

This application claims the priority of application Ser. No. 2007-205708, filed Aug. 7, 2007 in Japan, the subject matter of which is incorporated herein by reference.

TECHNICAL FIELD OF THE INVENTION

The present invention relates to a method for inspecting or observing (testing) characteristics of semiconductor devices, such as LSIs for LCD panel and to a method for fabricating the same.

BACKGROUND OF THE INVENTION

In general, for inspecting or observing semiconductor devices (LSIs) in a wafer state or a bare die state, a probe-test has been performed. In such a probe test, an inspection substrate, which is provided with a needle shape of probe, is used. The probe is contacted with a wire-connection pad on a semiconductor device (LSI) to be inspected, so that an electrical test or inspection is carried out to the semiconductor device (LSI). Since some of the characteristics of a semiconductor device may be changed when the semiconductor device is exposed to a light, a conventional probe test has been carried out in a dark box, shielding a light.

Recently, it becomes more frequently that customer (manufacture of end product) carries out mounting process of LSIs, because LSIs are used in a variety of types of apparatuses. For example, LSIs are used in a LCD panel for a mobile phone, a LCD panel for a digital camera, and the like.

It becomes a problem that a LSI for a LCD panel is exposed to a light in a practical use after the LSI is mounted by customer (manufacture of end product). For example, since a LCD panel is radiated with a back light in operation, such a back light is radiated also to a LSI non-preferably, which may cause deterioration or changes of characteristics of the LSI.

As a result, according to a conventional method for inspecting a LSI, a LSI that has been discriminated as a qualified (non-defective) product might not operate properly or normally in practical use.

Japanese Patent Publication 2000-121494A discloses a method for measuring an optical device, which is operating in response to a light. Unfortunately, such a method is applied to an optical device but is not applicable to a LSI according to the present invention.

[Patent Document] JP 2000-121494A

OBJECTS OF THE INVENTION

It is an object of the present invention is to provide a method for inspecting a semiconductor device which decreases an incidence rate of defective products at customer side (manufacture of end product).

Another object of the present invention is to provide a method for fabricating a semiconductor device, which decreases an incidence rate of defective products at customer side (manufacture of end product).

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a method for inspecting a semiconductor device includes the steps of: carrying out a first test for inspecting characteristic of semiconductor devices under a shielded (dark) condition to discriminate non-defective devices; and carrying out a second test to semiconductor devices, which have been passed the first test as non-defective devices, for inspecting characteristic of the semiconductor devices. The second test is carried out while a predetermined color of light is applied to semiconductor devices.

According to a second aspect of the present invention, a method for fabricating a semiconductor device includes the steps of: forming a plurality of semiconductor devices on a wafer; carrying out a first test for inspecting characteristic of semiconductor devices under a shielded (dark) condition to discriminate non-defective devices; and carrying out a second test to semiconductor devices, which have been passed the first test as non-defective devices, for inspecting characteristic of the semiconductor devices. The second test is carried out while a predetermined color of light is applied to semiconductor devices.

Here "passed a test" can mean "determined to be a non-defective product".

DESCRIPTION OF REFERENCE NUMERALS

10: Probe Card
12: Probe Needle
14: LED
26: [[16:]] LSI to be inspected

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

According to the present invention, a light is intentionally applied to a LSI that is under inspection. Since a light is not transmitted through a resin-molded LSI, the present invention could not be applicable to such a resin-molded LSI. The present invention is effective especially to a COF (Chip On Film) type, in which an upper surface of a LSI (silicon chip) is exposed, to a WSCP, in which a bottom surface of a LSI (silicon chip) is exposed, to a wafer (or bare die) state of semiconductor device, or the like.

Figure 1A:
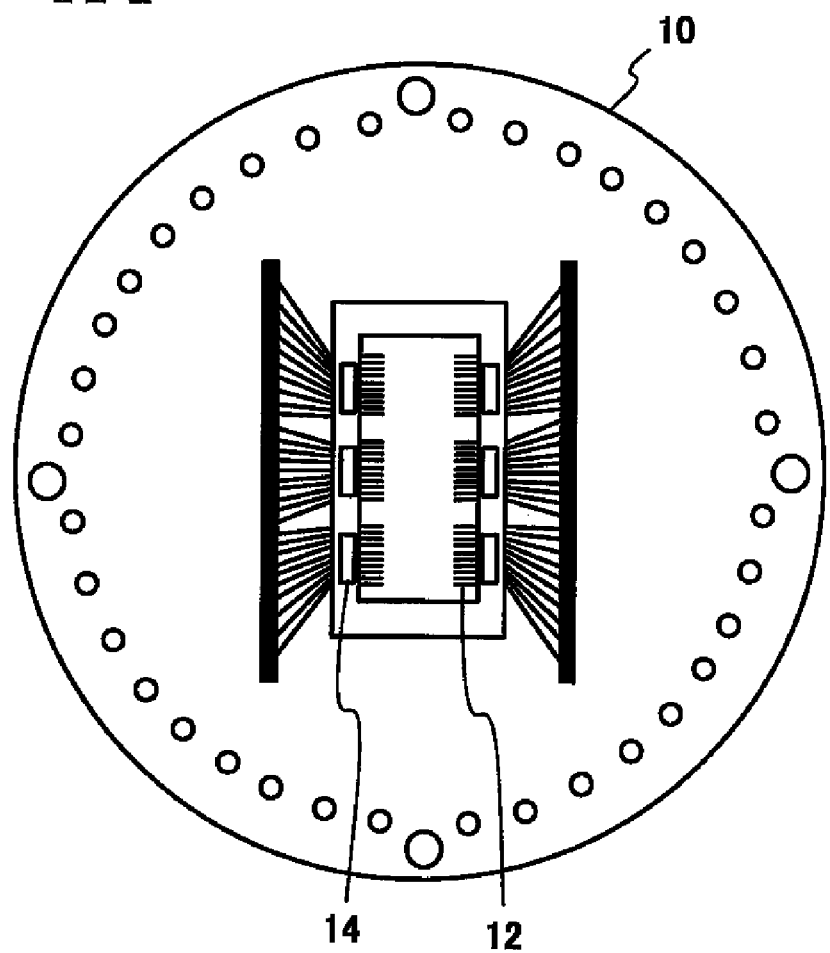
FIG. 1A is a bottom view illustrating a probe card used for an inspection method of a LSI according to the present invention.
Figure 1B:
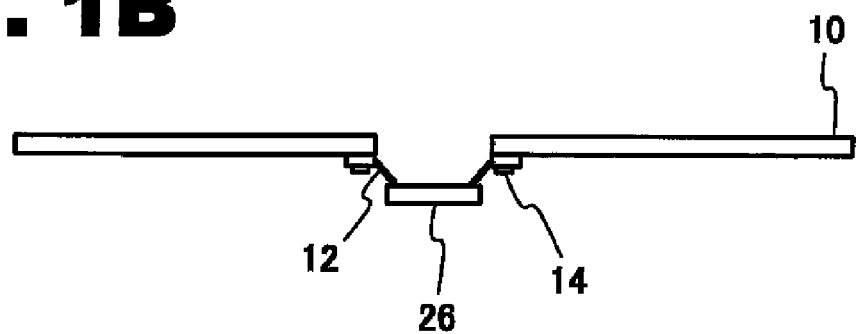
FIG. 1B is a side view illustrating a probe card, shown in FIG. 1A.

FIG. 1A is a bottom view illustrating a probe card used for an inspection method of a LSI according to the present invention. FIG. 1B is a side view illustrating a probe card, shown in FIG. 1A.

A round shape of probe card 10 is provided at its center with a rectangle opening, which basically corresponds to the shape of a LSI 26 to be inspected. A plurality of probes 12, connected to the substrate 10, are contacted with wire connection pads of the LSI 26, then an electrical test (inspection of characteristics) of the LSI 26 is carried out. On the probe card 10, white LEDs are provided at ends of the probes 12, so that a white light is irradiated to the LSI 26 while inspected.

The probe card 10 is designed to move in step-and-repeat manner over a semiconductor wafer when inspecting the LSI 26. The LSI 26 to be inspected may be a LSI for a LCD panel, used for a mobile phone, digital camera, PC display, television or the like. The present invention could not be applicable to an optical device operating in response to a light, but applicable to a LSI, which may be exposed to a light and possibly changes its characteristics by a light.

Figure 2:
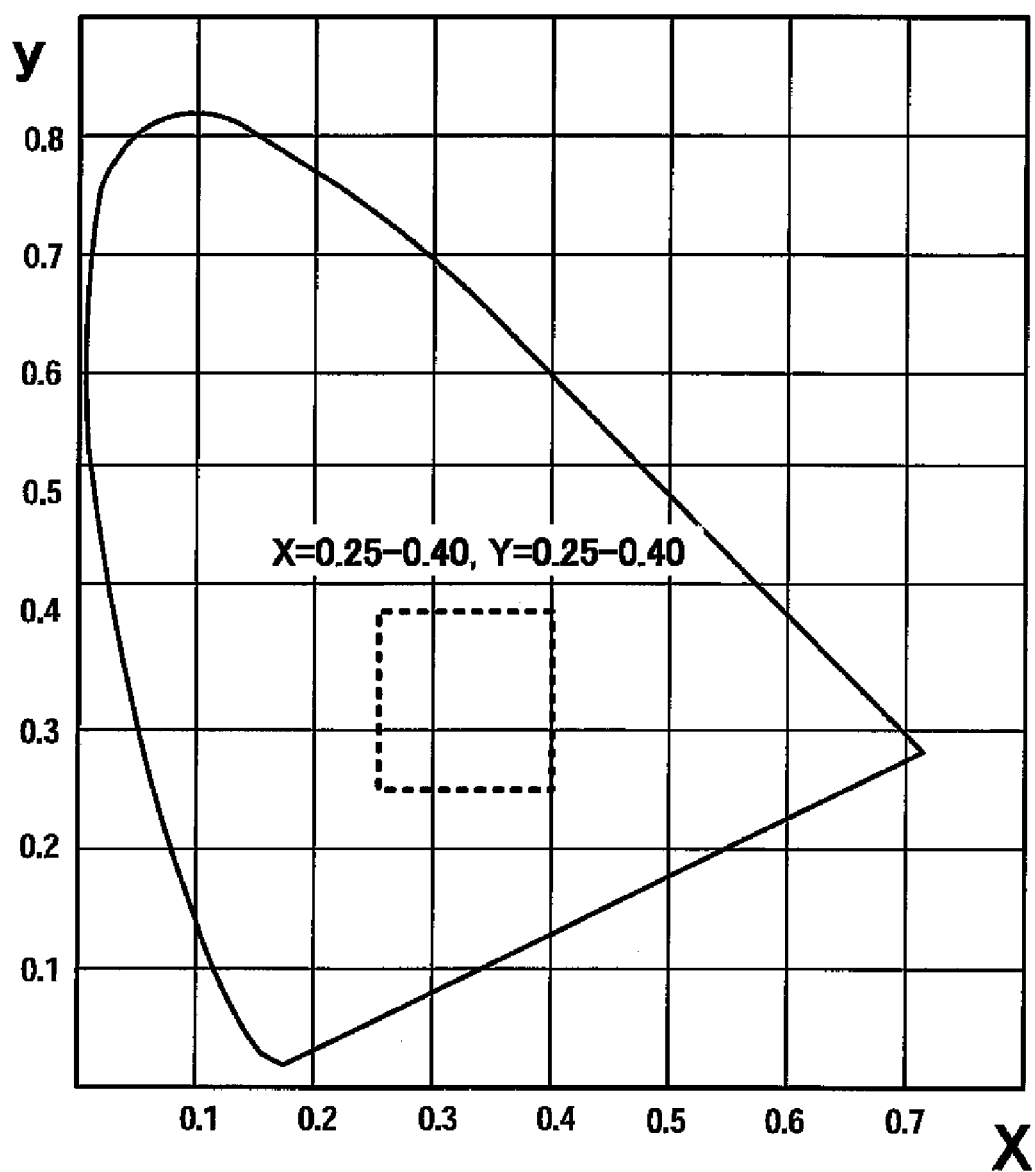
FIG. 2 is a graph showing a color range used for an inspection method of a LSI according to the present invention, which is based on chromatic coordinate according to JIS Z8110 (Japanese Industrial Standard).

The white LEDs 14 are designed to irradiate a light of the color in a range determined by "X=0.25 to 0.40, Y=0.25 to 0.40" based on chromatic coordinate according to JIS Z8110 (Japanese Industrial Standard). Here, the range of color (wavelength) irradiated from the white LEDs 14 is shown in FIG. 2 with a broken line. Such a range of wavelength (color) is determined so as to correspond to a wavelength of a backlight of the LSI 26 in practical use. If a light irradiated to the LSI 26 in practical use is not a white light, the light for inspection, applied from LEDs, could be changed to the practical color.

Figure 3:
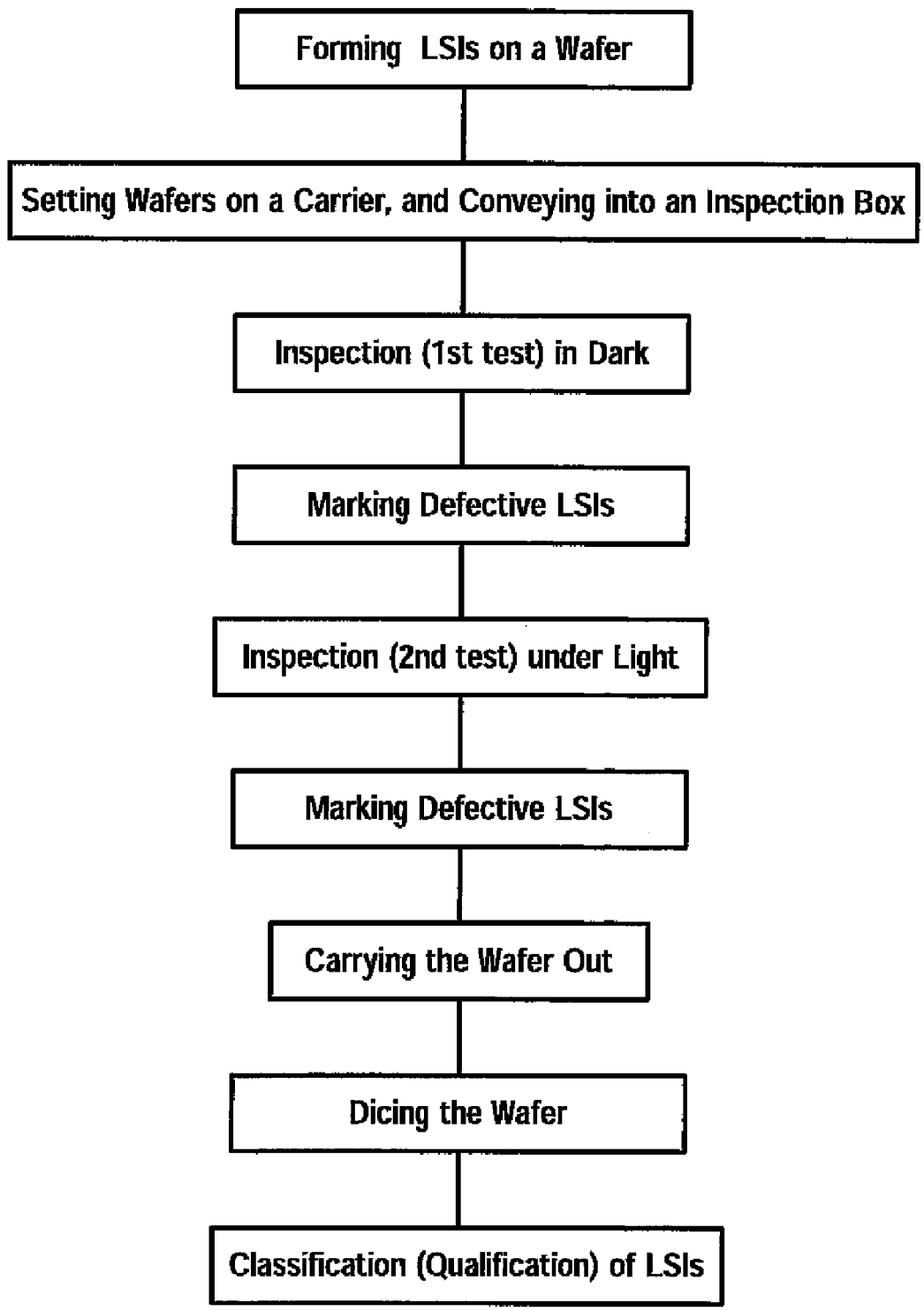
FIG. 3 is a flowchart showing fabrication steps for a LSI according to the present invention.

FIG. 3 is a flowchart showing inspection steps and fabrication steps for a LSI according to the present invention. First, a plurality of LSIs 26 is formed on a semiconductor wafer. The wafer is put on a carrier and is conveyed into an inspection box. After that, predetermined characteristics of the LSI 26 is inspected in dark using the probe card, shown in FIGS. 1A and 1B, according to a conventional method. The characteristics of the LSI 26 may include power consumption, frequency characteristic and leak current. As a result of the inspection in dark, LSIs 26 determined as defective products are defined by coordinates on the wafer and the information is stored in the test equipment.

Next, a second test (inspection) is carried out. The second test is carried out while a white light is applied from the LEDs 14 to the wafer in the inspection box. The second test may be performed to LSIs 26 that have been determined as non-defective products according to the first test in dark. As a result of the second test, LSIs 26 determined as defective products are defined by coordinates on the wafer and the information is stored in the test equipment. Only LSIs 26 passed both the first and second tests (inspections) are classified as non-defective products and shipped. Here, the second test (inspection) with light also can be carried out to LSIs that have been determined as defective products.

In the present invention, ON-OFF operation of the LEDs 14 can be controlled in accordance with the test program for characteristic inspection.

When the first and second tests are completed, the wafer is conveyed out of the inspection box. After that, a dicing process is carried out to the wafer to take the LSIs 26 out of the wafer. Among the individual LSIs 26, defective products are removed.

As described above, according to the present invention, LSIs are inspected or tested both in dark environment and light-irradiated environment. Therefore, factor(s) which bring defectiveness of LSIs can be easily specified or determined.

What is claimed is:

1. A method for inspecting a semiconductor device comprising:
   carrying out a first test for inspecting characteristics of semiconductor devices under a shielded (dark) condition to discriminate non-defective devices; and
   carrying out a second test on the semiconductor devices which have passed the first test as non-defective devices, for inspecting characteristics of the semiconductor devices,
   wherein the second test is carried out while a predetermined color of light is applied to the semiconductor devices, and the second test is carried out after the first test.

2. A method for inspecting a semiconductor device according to claim 1, wherein said semiconductor devices to be inspected are LSIs for a LCD panel.

3. A method for fabricating a semiconductor device comprising:
   forming a plurality of semiconductor devices on a wafer;
   carrying out a first test for inspecting characteristics of the semiconductor devices under a shielded (dark) condition to discriminate non-defective devices; and
   carrying out a second test on the semiconductor devices which have passed the first test as non-defective devices, for inspecting characteristics of the semiconductor devices,
   wherein the second test is carried out while a predetermined color of light is applied to the semiconductor devices, and the second test is carried out after the first test.

4. A method for fabricating a semiconductor device according to claim 3, further comprising:
   after the second test, dicing the wafer to divide the semiconductor devices from each other; and
   discriminating the semiconductor devices that have passed both the first and second tests.

5. A method for fabricating a semiconductor device according to claim 3, wherein said semiconductor devices to be inspected are LSIs for a LCD panel.

* * * * *